United States Patent
Hayamizu (10) Patent No.: US 8,541,927 B2
(45) Date of Patent: Sep. 24, 2013

(54) POWER GENERATION UNIT AND LIGHT EMITTING TOOL

(76) Inventor: Kohei Hayamizu, Mitaka (JP)

(\*) Notice: Subject to any disclaimer, the term of this patent is extended or adjusted under 35 U.S.C. 154(b) by 573 days.

(21) Appl. No.: 12/742,637

(22) PCT Filed: Nov. 11, 2008

(86) PCT No.: PCT/JP2008/003251
§ 371 (c)(1),
(2), (4) Date: Sep. 20, 2010

(87) PCT Pub. No.: WO2009/063609
PCT Pub. Date: May 22, 2009

(65) Prior Publication Data
US 2011/0018396 A1 Jan. 27, 2011

(30) Foreign Application Priority Data
Nov. 13, 2007 (JP) .................... 2007-294921

(51) Int. Cl.
*H01L 41/08* (2006.01)
*H02N 2/18* (2006.01)

(52) U.S. Cl.
USPC .......................................... 310/339

(58) Field of Classification Search
CPC .................................... H02N 2/185
USPC .......................................... 310/339
See application file for complete search history.

(56) References Cited

U.S. PATENT DOCUMENTS

| | | | | |
|---|---|---|---|---|
| 4,387,318 | A * | 6/1983 | Kolm et al. | 310/330 |
| 4,536,674 | A * | 8/1985 | Schmidt | 310/330 |
| 7,049,959 | B2 * | 5/2006 | Sakai | 340/545.5 |
| 7,667,376 | B2 * | 2/2010 | Schmidt | 310/339 |
| 7,692,365 | B2 * | 4/2010 | Churchill et al. | 310/339 |
| 7,808,158 | B1 * | 10/2010 | Deeds et al. | 310/339 |
| 7,812,508 | B2 * | 10/2010 | Abramovich et al. | 310/339 |
| 8,154,177 | B1 * | 4/2012 | Churchill et al. | 310/339 |
| 2004/0180791 | A1 * | 9/2004 | Cass et al. | 505/100 |
| 2008/0083139 | A1 * | 4/2008 | Mullen | 36/136 |
| 2008/0277941 | A1 * | 11/2008 | Bowles et al. | 290/54 |
| 2009/0322184 | A1 * | 12/2009 | Carman et al. | 310/339 |
| 2012/0230021 | A1 * | 9/2012 | Lynch | 362/183 |

FOREIGN PATENT DOCUMENTS

| | | |
|---|---|---|
| JP | 3-114404 U | 11/1991 |
| JP | 07-049418 A | 2/1995 |
| JP | 11-303726 A | 11/1999 |
| JP | 2005-312269 A | 11/2005 |
| JP | 2006-166694 A | 6/2006 |

\* cited by examiner

*Primary Examiner* — J. San Martin
(74) *Attorney, Agent, or Firm* — Sughrue Mion, PLLC (57) ABSTRACT

A flexible vibration board (12), a piezoelectric element (13) fixed to at least one side of the vibration board (12), and a fixed board (14) and a weight (16) for promoting deformation of the piezoelectric element (13) caused by vibration of the vibration board (12) are provided in the body (10). When the body (10) vibrates by receiving external force, the weight (16) rocks to cause vibration of the vibration board (12), or when the vibration board (12) vibrates, vibration of the vibration board (12) is sustained by the inertia of the weight (16) and the vibration board (12) deforms through vibration thus deforming the piezoelectric element (13) furthermore.

10 Claims, 7 Drawing Sheets

POWER GENERATION UNIT AND LIGHT EMITTING TOOL

CROSS REFERENCE TO RELATED APPLICATIONS

This application is a National Stage of International Application No. PCT/JP2008/003251 filed Nov. 11, 2008, claiming priority based on Japanese Patent Application No. 2007-294921, filed Nov. 13, 2007, the contents of all of which are incorporated herein by reference in their entirety.

TECHNICAL FIELD

The present invention relates to a power generation unit that converts an externally applied force into electricity and takes out the electricity, and relates to a light emitting tool that utilizes the power generation unit.

BACKGROUND ART

As a conventional power generating structure using a piezoelectric element, for example, there are known a structure that applies an external force directly to a piezoelectric element, thereby deforming the piezoelectric element to obtain an electromotive force (see, for example, Patent Document 1), and a structure that applies a force such as a wind force indirectly to a piezoelectric element, thereby deforming the piezoelectric element to obtain an electromotive force (see, for example, Patent Document 2).

Such a conventional piezoelectric element is formed in a flat plate shape and one end thereof is fixed on an installation surface. The piezoelectric element can freely vibrate around the fixed end.

Patent Document 1: Japanese Patent Application Laid-open No. H7-49418
Patent Document 2: Japanese Patent Application Laid-open No. H11-303726

DISCLOSURE OF INVENTION

Problem to be Solved by the Invention

However, power generation capacity obtained by one piezoelectric element is small. Therefore, to obtain certain necessary power, it is necessary to increase the size of the piezoelectric element or to use a large number of piezoelectric elements. Therefore, to constitute a light emitting tool using a piezoelectric element as a power supply, there has been a problem that the size and weight of the light emitting tool is increased.

The present invention has been achieved in view of the above problems, and an object of the present invention is to provide a power generation unit capable of enhancing power generating efficiency of a piezoelectric element, and to provide a light emitting tool utilizing the power generation unit.

Means for Solving Problems

To solve the above problems, one aspect of the present invention comprises a flexible vibration board, a piezoelectric element fixed on at least one of surfaces of the vibration board, and a deformation promoting unit that promotes deformation of the piezoelectric element caused by vibration of the vibration board.

Another aspect of the present invention comprises a body having a hollow part, and the power generation unit according to claim 1 is provided in the hollow part of the body.

EXPLANATIONS OF REFERENCE NUMERALS 1 power generation unit
10, 31 body
11, 35, 41, 51, 61, 71, 81, 91, 101, 111 power generation module
12, 62, 72, 82, 92, 102, 112 vibration board
62a, 72a, 82a, 92a, 102a, 112a first vibrating portion
62b, 72b, 82b, 92b, 102b, 112b second vibrating portion
72c, 102c bent portion
13 piezoelectric element
14 fixed board
15 stopper
16, 36, 42, 52, 53 weight
20 road
21 surface layer
22 base layer
23, 34 hollow part
30, 40, 50 lure
32 ring
33 hook
37 LED
93 wind receiving unit
93a wind receiving plate

BEST MODE(S) FOR CARRYING OUT THE INVENTION

Embodiments of a power generation unit and a light emitting tool according to the present invention will be explained below in detail with reference to the accompanying drawings. First, [I] the basic concept common to respective embodiments is explained, [II] specific contents of the respective embodiments are then explained, and finally [III] modifications of the respective embodiments are explained. Note that the present invention is not limited to the embodiments.

[I] Basic Concept Common to Respective Embodiments

The basic concept common to respective embodiments is described first. In a power generation unit according to the respective embodiments, a piezoelectric element that converts an external force into electricity and takes it out is fixed on a predetermined installation surface thereof.

One of features of the power generation unit according to the respective embodiments is that the piezoelectric element is fixed on a vibration board and a deformation promoting unit that promotes deformation of the piezoelectric element is provided on the power generation unit. The piezoelectric element is arranged to be deformed as the vibration board vibrates. With this arrangement, a deformation amount of the piezoelectric element can be increased and the power generating efficiency can be enhanced as compared with a case where the piezoelectric element alone vibrates and deforms. Further, by promoting the deformation of the piezoelectric element by the deformation promoting unit, it is possible to further increase the deformation amount of the piezoelectric element, and to enhance the power generating efficiency.

A specific usage mode of the power generation unit is arbitrary, and the power generation unit can be incorporated in any device or tool that generates power by utilizing vibration. A mode in which the power generation unit is installed below a surface of a road, and power is generated by utilizing vibration caused when cars run on the road, and a mode in which the power generation unit is installed in a light emitting tool, and power is generated by utilizing vibration of a vibration board are described below.

[II] Specific Contents of Respective Embodiments

Specific contents of the respective embodiments of the present invention are explained next with reference to the accompanying drawings.

First Embodiment

A first embodiment is explained first. The present embodiment is a basic mode of the power generation unit.

Figure 1:
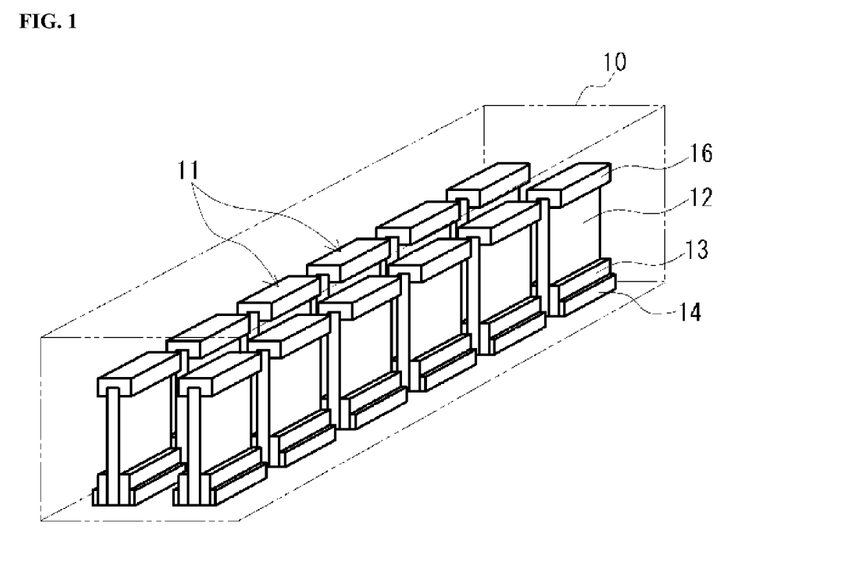
FIG. 1 A schematic perspective view of an entire power generation unit according to a first embodiment of the present invention.
Figure 2:
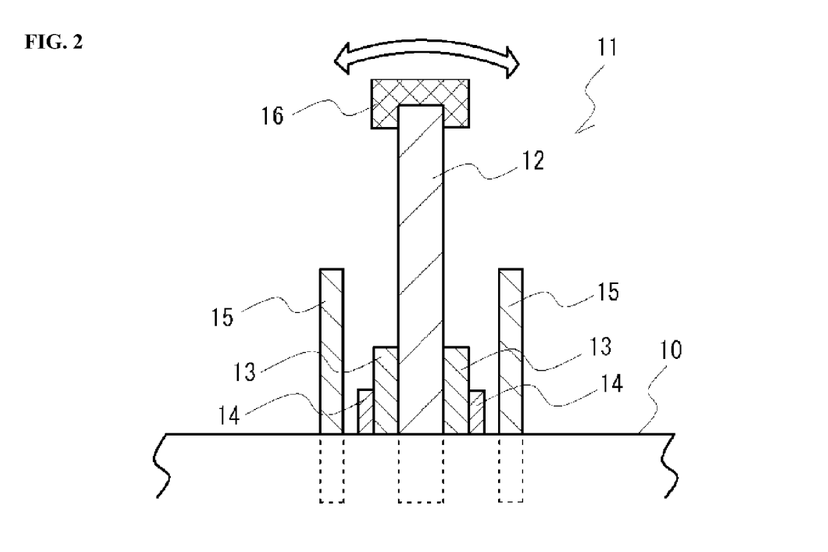
FIG. 2 A vertical sectional view showing a power generation module incorporated in the power generation unit shown in FIG. 1.
Figure 3:
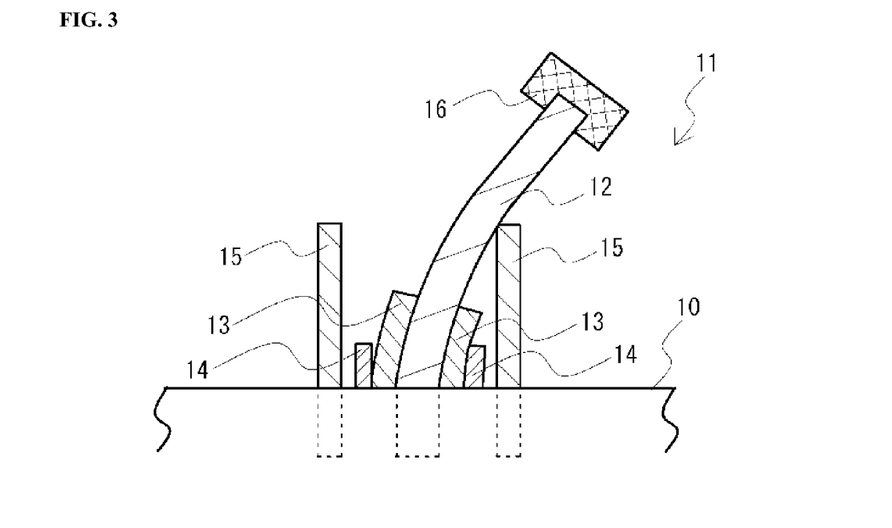
FIG. 3 A vertical sectional view showing the power generation module in a deformed state.
Figure 4:
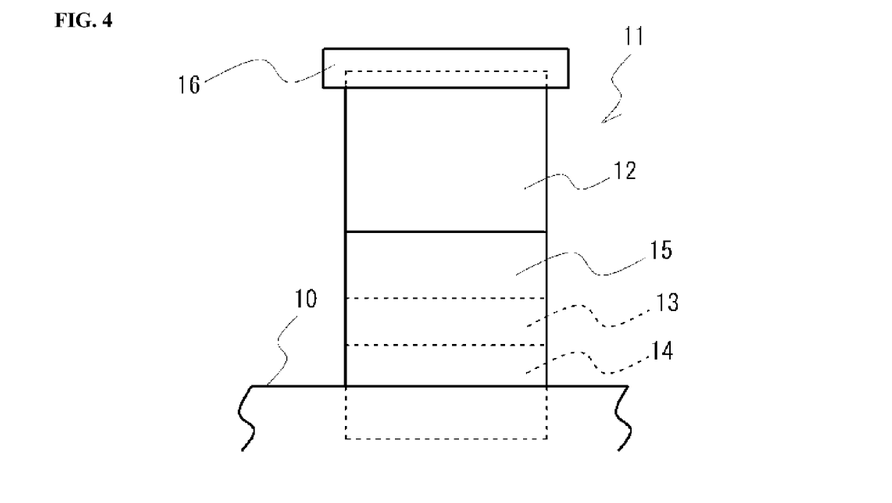
FIG. 4 A side view of the power generation module shown in FIG. 2.

FIG. 1 is a schematic perspective view of an entire power generation unit according to the first embodiment, FIG. 2 is a vertical sectional view showing a power generation module incorporated in the power generation unit shown in FIG. 1, FIG. 3 is a vertical sectional view showing the power generation module in a deformed state, and FIG. 4 is a side view of the power generation module shown in FIG. 2. As shown in FIG. 1, a power generation unit 1 is configured to have plural power generation modules 11 provided in a body 10. A bottom surface of the body 10 corresponds to the installation surface in the appended claims, and the power generation modules 11 are fixed on the bottom surface (in FIGS. 1 and 4, stoppers 15 are omitted for illustration convenience).

As shown in FIGS. 2 to 4, each of the power generation modules 11 includes a vibration board 12, a piezoelectric element 13, a fixed board 14, and a stopper 15.

The vibration board 12 is a supporting body that applies a pressure to the piezoelectric element 13, and also functions as a reinforcing material that reinforces a cracking strength of the piezoelectric element 13. The vibration board 12 is made of a material having flexibility and durability (for example, metal such as brass and aluminum, or plastic such as vinyl chloride). While the material of the vibration board 12 is arbitrary, a stainless thin plate can be used, for example. While the flat surface shape of the vibration board 12 is arbitrary, it is preferable that the vibration board 12 equally deforms with respect to an external force, and the vibration board 12 has a vertically long rectangular shape in the first embodiment. One end of the vibration board 12 in its longitudinal direction is fixed on the body 10. The vibration board 12 vibrates together with the body 10. Particularly, it is preferable that the vibration board 12 vibrates greater than that when the piezoelectric element 13 is arranged alone. Therefore, the vibration board 12 is formed wider in surface than the piezoelectric element 13 so that an end of the vibration board 12 that is not fixed extends to an outer side than an end of the piezoelectric element 13.

A weight 16 is mounted on the non-fixed end of the both ends of the vibration board 12 that is not fixed on the body 10. The weight 16 promotes vibration of the vibration board 12, thereby promoting deformation of the piezoelectric element 13. The weight 16 corresponds to the deformation promoting unit in the appended claims. The weight 16 is fixed on the vibration board 12 by an adhesive or by a fitting structure. When the weight 16 rocks, the vibration board 12 vibrates, or when the vibration board 12 vibrates, the vibration of the vibration board 12 is continued by inertia of the weight 16. The weight 16 can be provided at a location other than the non-fixed end, and can be provided on a side surface of the vibration board 12, or a connecting member can be arranged between the vibration board 12 and the weight 16, for example. To apply a greater force to the fixed end of the vibration board 12, it is preferable that the weight 16 is arranged near the end opposite from the fixed end.

The piezoelectric element 13 generates electricity by being deformed by a pressure. For example, the piezoelectric element 13 is made of piezoelectric ceramic such as barium titanate and zirconia, or piezoelectric single crystal such as lithium tantalate (LiTaO3). Any arbitrary material that can generate power by an external force (including forces to generate distortion, bending, or compression) can be used as the piezoelectric element 13 or instead of the piezoelectric element 13. For example, it is possible to use IPMC (Ionic Polymer-Metal Composite) in which both surfaces of an ionic conductive polymer film (gel) are plated with metal (such as gold), ICPF (Ionic Conducting Polymergel Film), or an artificial muscle using IPMC or ICPF. The piezoelectric elements 13 are formed in a thin plate shape, and fixed on both surfaces of the vibration board 12 by an adhesive. While the flat surface shape of the piezoelectric elements 13 is arbitrary, the piezoelectric elements 13 preferably have a shape similar to that of the vibration board 12. In the first embodiment, the flat surface shape of the piezoelectric elements 13 is a square shape having a diameter smaller than that of the vibration board 12. While arrangement positions of the piezoelectric elements 13 with respect to the vibration board 12 are also arbitrary, in the present embodiment, the piezoelectric elements 13 are arranged at locations close to the fixed end of the vibration board 12. Although not shown, a plus terminal is provided on one of surfaces of the piezoelectric element 13 and a minus terminal is provided on the other surface thereof. A plus lead wire connected to the plus terminal and a minus lead wire connected to the minus terminal are pulled out, and these lead wires are connected to a load (not shown). With this arrangement, power is supplied to the load. Note that various electric elements such as a known bridge circuit can be arranged between the piezoelectric element 13 and the load. Although the piezoelectric elements 13 are fixed on the both surfaces of the vibration board 12, the piezoelectric element 13 can be fixed only on one of the surfaces of the vibration board 12.

The fixed boards 14 function as a fulcrum when the piezoelectric element 13 deforms. The fixed boards 14 correspond to the deformation promoting unit and the fixing unit in the appended claims. The fixed board s14 are arranged on sides of the piezoelectric elements 13 at locations sandwiching the vibration board 12 and the piezoelectric elements 13. One end of the fixed boards 14 in the longitudinal direction is fixed on the body 10. It is preferable that a distance between the fixed board 14 and the piezoelectric element 13 is determined such that the piezoelectric element 13 comes into contact with the fixed board 14 when the piezoelectric element 13 deforms, and such that the piezoelectric element 13 and the fixed board 14 come into close contact with each other.

Particularly, to enhance the power generating efficiency, it is preferable that the fixed board 14 is fixed such that the widest portion of the piezoelectric element 13 becomes a center of deformation of the piezoelectric element 13. This is because that an electromotive force is generated by a variation amount of deformation of the piezoelectric element 13 itself, and thus, when the fixed board 14 is fixed such that the widest portion of the piezoelectric element 13 becomes the center of deformation, the variation amount of the element becomes the greatest. Specifically, it is preferable that the mutual positional relation between the piezoelectric element 13 and the fixed board 14, and the shapes of the piezoelectric element 13 and the fixed board 14 are determined such that an edge of the fixed board 14 that comes into contact with the piezoelectric element 13 cuts across the widest portion of a side surface of the piezoelectric element 13 over a wide range as wide as possible. For example, it is preferable that when the piezoelectric element 13 is formed in a plate body having a square side surface and the piezoelectric element 13 stands along the vertical direction, an upper edge of the fixed board 14 abuts against the piezoelectric element 13 along one of diagonal lines of the piezoelectric element 13. Alternatively, it is also preferable that when the piezoelectric element 13 is formed in a plate body having a circular side surface and stands along the vertical direction, the upper edge of the fixed board 14 abuts against the piezoelectric element 13 along a horizontal line that cuts across a center of the circle of the piezoelectric element 13. In the first embodiment, as shown in the drawings, each of the piezoelectric elements 13 is formed in the plate body having a square side surface and stands along the vertical direction, each of the fixed boards 14 is formed in the plate body having the same width as that of the piezoelectric element 13, and an upper edge of the fixed board 14 horizontally cuts across the side surface of the piezoelectric element 13. As another shape, the fixing unit can be formed in a cubic shape, and can be arranged on the side of the piezoelectric element 13.

The stoppers 15 restrict a vibration range of the vibration board 12, and correspond to the restricting units in the appended claims. Each of the stoppers 15 is arranged on the side of the fixed board 14 and on the other side from the vibration board 12 and the piezoelectric element 13, and one end of the stopper 15 in its longitudinal direction is fixed on the body 10. It is preferable that a distance between the stopper 15 and the fixed board 14 is a distance such that the vibration board 12 is allowed to deform, and is determined such that the vibration board 12 comes into contact with the stopper 15 immediately before the vibration board 12 excessively vibrates to such a degree that the vibration board 12 plastically deforms. While the shape of the stopper 15 is arbitrary, it is preferable that the shape of the stopper 15 is similar to that of the vibration board 12. In the first embodiment, the stopper 15 has a plate body shape, which is smaller than the vibration board 12. As another shape, the stopper 15 can be formed in a cubic shape and can be arranged on the side of a fixed body, for example.

In such a structure, when the body 10 receives an external force and vibrates, the piezoelectric element 13 deforms and an electromotive force is generated. Particularly, the vibration board 12 is vibrated not by vibrating and deforming the piezoelectric element 13 alone but by rocking the weight 16, or when the vibration board 12 vibrates, the vibration board 12 is deformed by vibration by keeping the vibration of the vibration board 12 using inertia of the weight 16 and with this arrangement, the piezoelectric element 13 is further largely deformed. From this, as compared with a case where the piezoelectric element 13 alone is deformed, a greater electromotive force is generated from the piezoelectric element 13, and thus the power generating efficiency can be enhanced. Further, a portion of a side of the piezoelectric element 13 is fixed by the fixed board 14, and with this arrangement, the piezoelectric element 13 is deformed around the fixed part, and a greater electromotive force is generated. Therefore, the power generating efficiency can be enhanced. Furthermore, even when the vibration board 12 is largely deformed, because its movement is restricted by the stopper 15, it is possible to prevent the vibration board 12 from being plastically deformed and damaged.

Effect of First Embodiment

According to the first embodiment, by deforming the piezoelectric element 13 through the vibration board 12, a greater electromotive force can be obtained from the piezoelectric element 13, and the power generating efficiency can be enhanced. Further, deformation of the piezoelectric element 13 is promoted around the fixed board 14, and the power generating efficiency can be further enhanced. Furthermore, by restricting the deformation of the vibration board 12 by the stopper 15, it is possible to prevent the vibration board 12 from being damaged, and the durability of the power generation module 11 can be enhanced.

Second Embodiment

A second embodiment is explained next. This embodiment is a mode in which the power generation unit according to the first embodiment is arranged below a surface of a road. The configuration of the second embodiment is substantially identical to the configuration of the first embodiment unless otherwise specified. Constituent elements of the second embodiment substantially identical to those of the first embodiment are denoted by like reference numerals and/or names used in the first embodiment as necessary, and explanations thereof will be omitted.

Figure 5:
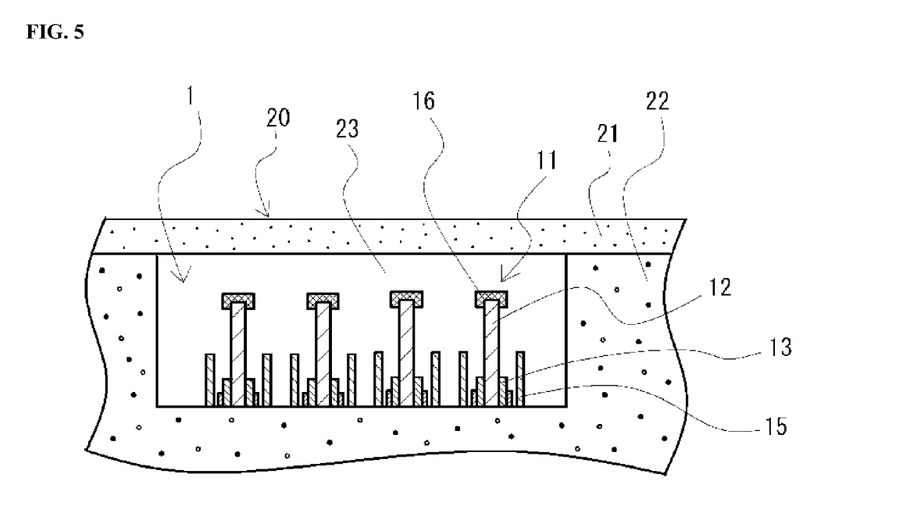
FIG. 5 A vertical sectional view of relevant parts of a road according to a second embodiment.

FIG. 5 is a vertical sectional view of relevant parts of a road according to the second embodiment. A road 20 is formed by laying a surface layer 21 on a surface of a base layer 22 by asphalt or the like. A hollow part 23 is formed in the base layer 22, and the power generation unit 1 according to the first embodiment is arranged in the hollow part 23. An upper surface of the power generation unit 1 is located directly below the base layer 22. When cars run on the surface layer 21 of the road 20, vibration of the surface layer 21 is transmitted to the power generation module 11, the vibration is transmitted to the piezoelectric elements 13 through the vibration boards 12 and an electromotive force is generated. The usage of the electromotive force is arbitrary, and the electromotive force can be used for illuminating lights embedded in a side surface of the road 20.

The road is a concept including a bridge, a tunnel, and a runway. The power generation unit 1 can be arranged at any location other than below a surface of a road, and can be embedded in an upper surface of a tunnel or a guardrail arranged on a side of the road surface, for example.

Effect of Second Embodiment

According to the second embodiment, power can be generated by utilizing vibration from cars that run on the surface layer 21 of the road 20. Therefore, vibration energy that has been conventionally wasted can be utilized effectively.

Third Embodiment

A third embodiment is explained next. This embodiment is a mode in which the power generation module according to the first embodiment is arranged in a fishing lure, which is a light emitting tool. The configuration of the third embodiment is substantially identical to the configuration of the first embodiment unless otherwise specified. Constituent elements of the third embodiment substantially identical to those of the first embodiment are denoted by like reference numerals and/or names used in the first embodiment as necessary, and explanations thereof will be omitted.

Figure 6:
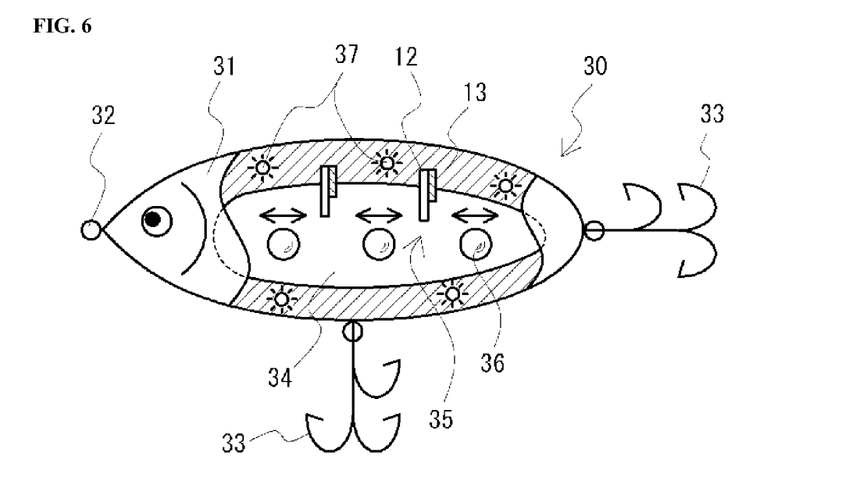
FIG. 6 A side view of a lure according to a third embodiment, being a partially cut away view.

FIG. 6 is a side view of a lure according to the third embodiment (FIG. 6 is a partially cut away view, and this applies to FIGS. 7 to 8 mentioned below). A lure 30 corresponds to the light emitting tool in the appended claims, and a body 31 of the lure 30 is made of a translucent resin and formed in a fish-like shape. A ring 32 to tie a fishing line is fixed to a front end of the body 31, and hooks 33 are fixed on a bottom surface or a rear end of the lure 30.

A hollow part 34 is provided in the body 31, and a power generation module 35, weights 36, and LEDs 37 are provided in the hollow part 34.

The power generation module 35 only includes the vibration boards 12 and the piezoelectric elements 13. Each of the vibration boards 12 is fixed such that it projects downward from an upper surface of the body 31 as the installation surface, and the piezoelectric element 13 is fixed on one side surface of the vibration board 12 by an adhesive. The vibration board 12 is formed vertically longer than the piezoelectric element 13, and a free end of the vibration board 12 projects lower than the piezoelectric element 13.

Each of the weights 36 promotes deformation of the piezoelectric element 13 by promoting vibration of the vibration board 12, and the weight 36 corresponds to the deformation promoting unit in the appended claims. The weight 36 is formed in a spherical shape. As the body 31 vibrates, the weight 36 freely moves in the hollow part 34 and collides against the free end of the vibration board 12, thereby promoting vibration of the vibration board 12, and promotes deformation of the piezoelectric element 13.

The LED 37 calls attention of fish, and is fixed to an arbitrary position in the hollow part 34. The LED 37 is connected to the piezoelectric element 13 through a control circuit (not shown), and the LED 37 emits light by an electromotive force of the piezoelectric element 13. This light is emitted outside of the lure 30 through the body 31.

Figure 7:
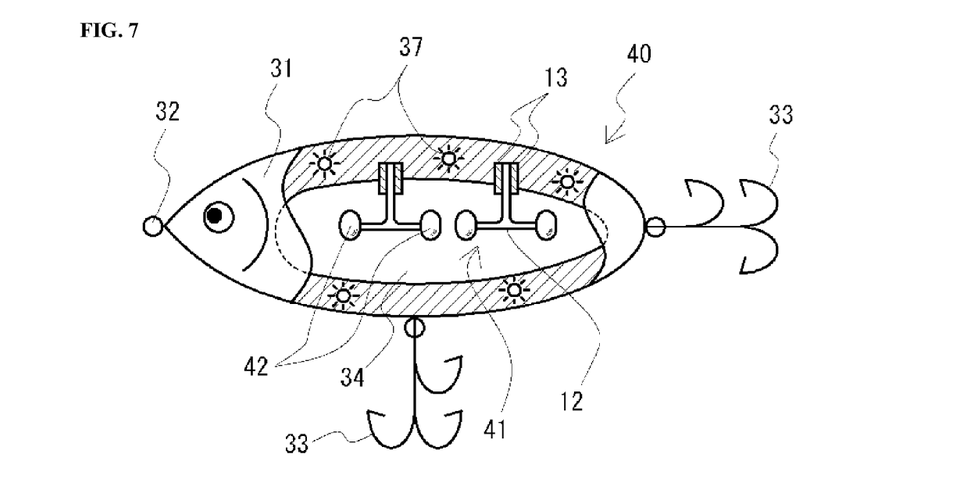
FIG. 7 A side view of a lure according to a modification example, being a partially cut away view.

In addition to the above configuration, various modes of the power generation module in the lure can be employed. FIG. 7 is a side view of a lure 40 according to a modification example. A power generation module 41 is configured to include the vibration boards 12 and the piezoelectric elements 13. Each of the vibration boards 12 is formed in a T-shape whose side is oriented downward, the piezoelectric elements 13 are fixed on both surfaces of a base of each of the vibration boards 12, and weights 42 are respectively fixed on both sides of a lower end of the vibration board 12. The weight 42 promotes vibration of the vibration board 12, and can promote deformation of the piezoelectric element 13.

Figure 8:
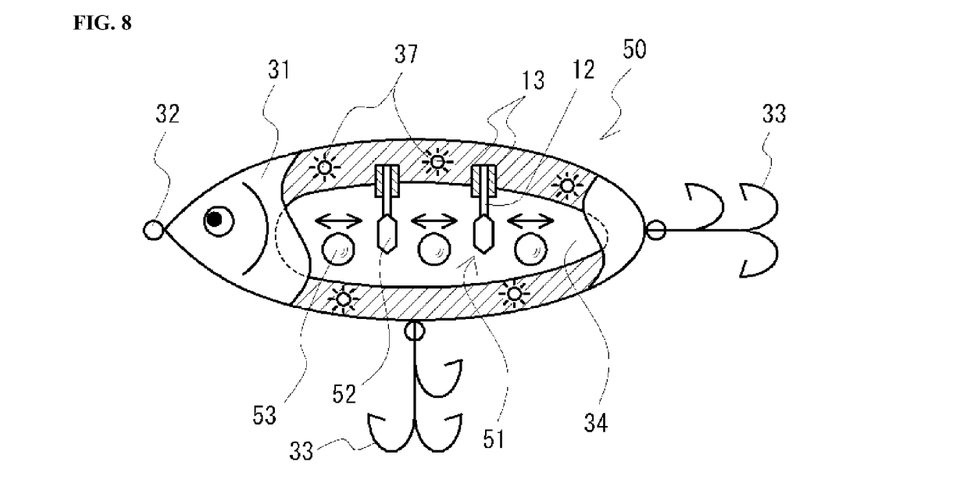
FIG. 8 A side view of a lure according to the modification example, being a partially cut away view.

FIG. 8 is a side view of a lure 50 according to the modification example. A power generation module 51 includes the vibration boards 12 and the piezoelectric elements 13. The piezoelectric elements 13 are fixed on both surface of a base of each of the vibration boards 12, and weights 52 are fixed to lower ends of the vibration boards 12. Weights 53 are provided in the hollow part 34. When the weight 53 collides against the weight 52 of the vibration board 12, the weight 53 promotes vibration of the vibration board 12, and can promote deformation of the piezoelectric element 13.

Effect of Third Embodiment

According to the third embodiment, power can be generated by utilizing vibration of the body when a lure moves on a water surface or in water. Therefore, vibration energy that has been conventionally wasted can be utilized effectively. Further, light emitted from the LED calls attention of fish, and thus the fish collecting performance of the lure can be enhanced.

Fourth Embodiment

A fourth embodiment is explained next. This embodiment is a mode in which the shape of the vibration board of the power generation module according to the first embodiment is changed. The configuration of the fourth embodiment is substantially identical to the configuration of the first embodiment unless otherwise specified. Constituent elements of the fourth embodiment substantially identical to those of the first embodiment are denoted by like reference numerals and/or names used in the first embodiment as necessary, and explanations thereof will be omitted.

Figure 9:
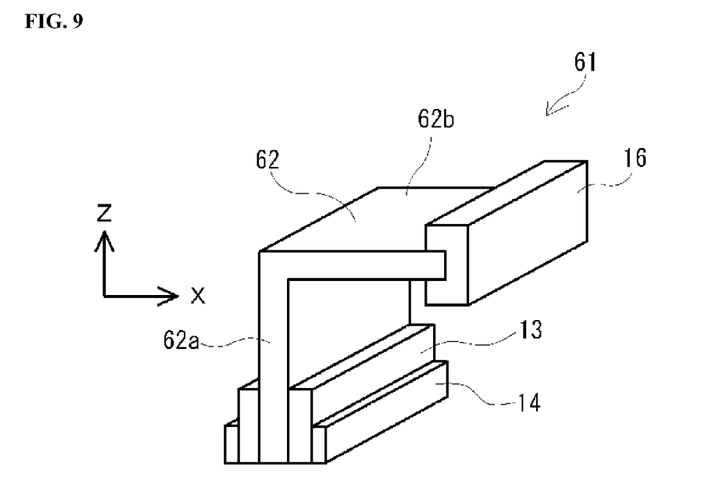
FIG. 9 A perspective view of relevant parts of a power generation module according to a fourth embodiment.

FIG. 9 is a perspective view of relevant parts of a power generation module according to the fourth embodiment (for illustration convenience, the body 10 and the stopper 15 are omitted in FIGS. 9 and 10 to 14 mentioned below). A power generation module 61 according to the fourth embodiment includes a vibration board 62. The vibration board 62 is formed by connecting a first vibrating portion 62a that is arranged in a direction (in the Z-direction shown in the drawing) extending along the piezoelectric element 13 and a second vibrating portion 62b arranged in a direction (in the X-direction shown in the drawing) perpendicular to the Z-direction with each other such that the vibrating portions intersect with each other at right angles. The weight 16 is fixed to a free end of the second vibrating portion 62b. According to this structure, when vibration along the Z-direction is generated, the second vibrating portion 62b vibrates, and when vibration along the X-direction is generated, the first vibrating portion 62a vibrates. Accordingly, the piezoelectric element 13 can be deformed by the vibration, and thus two-dimensional vibration in the Z-direction and X-direction can be utilized for generating power.

A specific connecting structure between the first vibrating portion 62a and the second vibrating portion 62b is arbitrary. For example, the first vibrating portion 62a and the second vibrating portion 62b are formed in one sheet of a continuous flat plate, and thereafter the second vibrating portion 62b can be bent such that it intersects with the first vibrating portion 62a at right angles, or the first vibrating portion 62a and the second vibrating portion 62b can be formed separately from each other, and thereafter they can be connected to each other by a known connecting method including welding.

When the power generation module 61 formed in this manner is used instead of the power generation modules 11, 35, 41, and 51 according to the first to third embodiments, or used together with the power generation modules 11, 35, 41, and 51, it is possible to further enhance the power generating efficiency.

Effect of Fourth Embodiment

According to the fourth embodiment, because two-dimensional vibration in the Z-direction and X-direction can be utilized for generating power, it is possible to further enhance the power generating efficiency.

Fifth Embodiment

A fifth embodiment is explained next. This embodiment is a mode in which the shape of the vibration board of the power generation module according to the fourth embodiment is changed. The configuration of the fifth embodiment is substantially identical to the configuration of the fourth embodiment unless otherwise specified. Constituent elements of the fifth embodiment substantially identical to those of the fourth embodiment are denoted by like reference numerals and/or names used in the fourth embodiment as necessary, and explanations thereof will be omitted.

Figure 10:
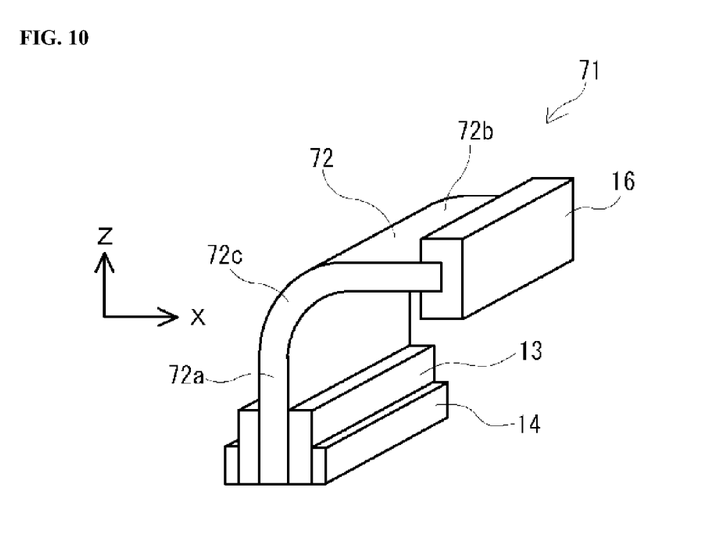
FIG. 10 A perspective view of relevant parts of a power generation module according to a fifth embodiment.

FIG. 10 is a perspective view of relevant parts of a power generation module according to the fifth embodiment. A power generation module 71 according to the fifth embodiment includes a vibration board 72. The vibration board 72 is formed by connecting a first vibrating portion 72a that is arranged in a direction (in the Z-direction shown in the drawing) extending along the piezoelectric element 13 and a second vibrating portion 72b arranged in a direction (in the X-direction shown in the drawing) perpendicular to the Z-direction with each other through a bent portion 72c. The weight 16 is fixed to a free end of the second vibrating portion 72b.

A specific connecting structure of the first vibrating portion 72a, the second vibrating portion 72b and the bent portion 72c is arbitrary. For example, the first vibrating portion 72a, the second vibrating portion 72b, and the bent portion 72c can be formed in one sheet of a continuous flat plate, and thereafter the second vibrating portion 72b can be gently bent with respect to the first vibrating portion 72a, thereby forming the bent portion 72c.

When the power generation module 71 formed in this manner is used instead of the power generation modules 11, 35, 41, 51, and 61 according to the first to fourth embodiments, or used together with the power generation modules 11, 35, 41, 51, and 61, it is possible to further enhance the power generating efficiency.

Effect of Fifth Embodiment

According to the fifth embodiment, because two-dimensional vibration in the Z-direction and X-direction can be utilized for generating power, it is possible to further enhance the power generating efficiency.

Sixth Embodiment

A sixth embodiment is explained next. This embodiment is a mode in which the shape of the vibration board of the power generation module according to the fourth embodiment is changed. The configuration of the sixth embodiment is substantially identical to the configuration of the fourth embodiment unless otherwise specified. Constituent elements of the sixth embodiment substantially identical to those of the fourth embodiment are denoted by like reference numerals and/or names used in the fourth embodiment as necessary, and explanations thereof will be omitted.

Figure 11:
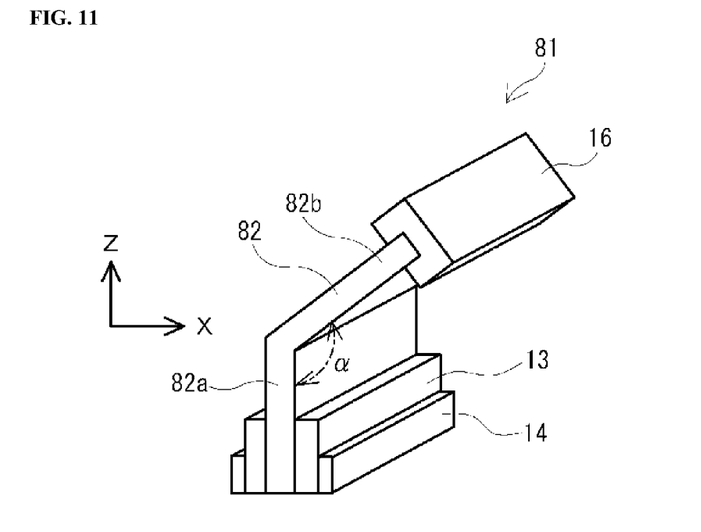
FIG. 11 A perspective view of relevant parts of a power generation module according to a sixth embodiment.

FIG. 11 is a perspective view of relevant parts of a power generation module according to the sixth embodiment. A power generation module 81 according to the sixth embodiment includes a vibration board 82. The vibration board 82 is formed by connecting a first vibrating portion 82a arranged in a direction (in the Z-direction shown in the drawing) extending along the piezoelectric element 13 and a second vibrating portion 82b arranged in a direction forming an angle $\alpha$ with respect to the Z-direction with each other. The weight 16 is fixed to a free end of the second vibrating portion 82b.

A specific connecting structure between the first vibrating portion 82a and the second vibrating portion 82b is arbitrary. For example, the first vibrating portion 82a and the second vibrating portion 82b can be formed in one sheet of a continuous flat plate, and thereafter the second vibrating portion 82b can be bent at the angle $\alpha$ with respect to the first vibrating portion 82a, thereby forming the vibration board 82.

When the power generation module 81 formed in this manner is used instead of the power generation modules 11, 35, 41, 51, 61 and 71 according to the first to fifth embodiments, or used together with the power generation modules 11, 35, 41, 51, 61 and 71, it is possible to further enhance the power generating efficiency.

Effect of Sixth Embodiment

According to the sixth embodiment, because two-dimensional vibration in the Z-direction and X-direction can be utilized for generating power, it is possible to further enhance the power generating efficiency.

Seventh Embodiment

A seventh embodiment is explained next. This embodiment is a mode in which the shape of the vibration board of the power generation module according to the fourth embodiment is changed. The configuration of the seventh embodiment is substantially identical to the configuration of the fourth embodiment unless otherwise specified. Constituent elements of the seventh embodiment substantially identical to those of the fourth embodiment are denoted by like reference numerals and/or names used in the fourth embodiment as necessary, and explanations thereof will be omitted.

Figure 12:
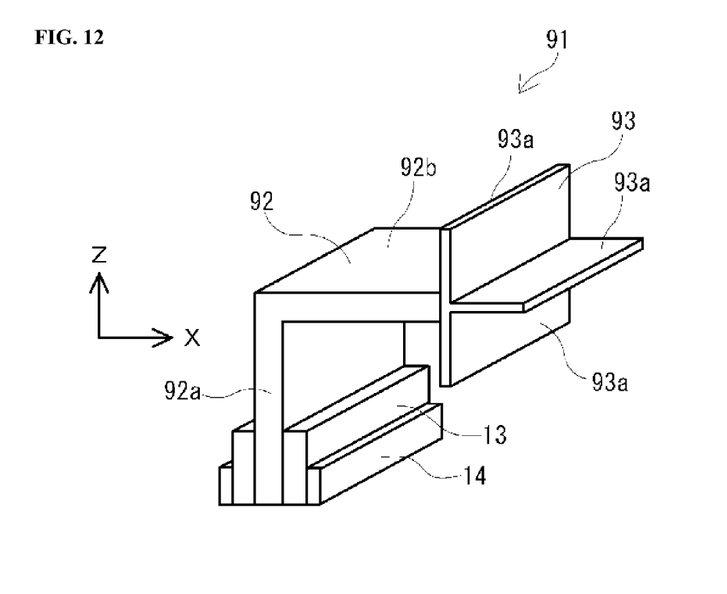
FIG. 12 A perspective view of relevant parts of a power generation module according to a seventh embodiment.

FIG. 12 is a perspective view of relevant parts of a power generation module according to the seventh embodiment. A power generation module 91 according to the seventh embodiment includes a vibration board 92. The vibration board 92 is formed by connecting a first vibrating portion 92a that is arranged in a direction (in the Z-direction shown in the drawing) extending along the piezoelectric element 13 and a second vibrating portion 92b arranged in a direction (in the X-direction shown in the drawing) perpendicular to the Z-direction with each other such that the vibrating portions intersect with each other at right angles. A specific connecting structure between the first vibrating portion 92a and the second vibrating portion 92b is arbitrary, and the same connecting structure as that between the first vibrating portion 62a and the second vibrating portion 62b described in the fourth embodiment can be employed, for example.

A wind receiving unit 93 is fixed to a free end of the second vibrating portion 92b. The wind receiving unit 93 is wind receiving means for vibrating the vibration board 92 by receiving a wind force. The wind receiving unit 93 is constituted by connecting plural (three in FIG. 12) wind receiving plates 93a to each other at a predetermined angle therebetween (an angle of intersecting with each other at right angles). By providing the wind receiving unit 93 in this manner, even if there is no vibration, when there is a wind, it is possible to vibrate the vibration board 92 by a force of the wind. Further, by setting the weight of the wind receiving unit 93 appropriately, the wind receiving unit 93 can be provided with the same function as that of the weight 16 according to the fourth embodiment, and it is possible to obtain the vibration promoting effect at the same time. By arranging the plural wind receiving plates 93a in different directions from each other, forces of winds blowing from various directions can be utilized. The number, the shape, and the connecting angle of the wind receiving plates 93a to each other can be arbitrarily changed, and for example, four or more wind receiving plates 93a can be connected with each other through an angle through which the wind receiving plates 93a do not intersect with each other at right angles.

When the power generation module 91 formed in this manner is used instead of the power generation modules 11, 35, 41, 51, 61, 71, and 81 according to the first to sixth embodiments, or used together with the power generation modules 11, 35, 41, 51, 61, 71, and 81, it is possible to further enhance the power generating efficiency.

Effect of Seventh Embodiment

According to the seventh embodiment, because two-dimensional vibration in the Z-direction and X-direction can be utilized for generating power, it is possible to further enhance the power generating efficiency. Particularly, the vibration board 92 can be vibrated by a wind force, and thus, even if there is no vibration, it is possible to generate power.

Eighth Embodiment

An eighth embodiment is explained next. This embodiment is a mode in which the shape of the vibration board of the power generation module of the fourth embodiment is changed. The configuration of the eighth embodiment is substantially identical to the configuration of the fourth embodiment unless otherwise specified. Constituent elements of the eighth embodiment substantially identical to those of the fourth embodiment are denoted by like reference numerals and/or names used in the fourth embodiment as necessary, and explanations thereof will be omitted.

Figure 13:
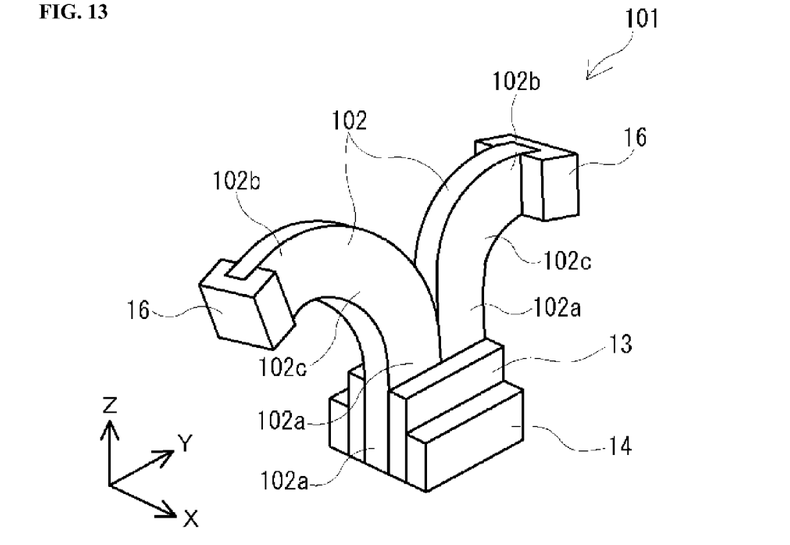
FIG. 13 A perspective view of relevant parts of a power generation module according to an eighth embodiment.

FIG. 13 is a perspective view of relevant parts of a power generation module according to the eighth embodiment. A power generation module 101 according to the eighth embodiment includes a pair of vibration boards 102. Each of the vibration boards 102 is formed by connecting a first vibrating portion 102a that is arranged in a direction (in the Z-direction shown in the drawing) extending along the piezoelectric element 13 and a second vibrating portion 102b arranged in a direction (in the Y-direction shown in the drawing) perpendicular to the Z-direction with each other through a bent portion 102c. The weight 16 is fixed to a free end of the second vibrating portion 102b. According to this structure, when vibration along the direction (the X-direction shown in the drawing) perpendicular to the Z-direction and the Y-direction is generated, the first vibrating portion 102a vibrates, and when vibration along the Z-direction is generated, the second vibrating portion 102b vibrates, and the piezoelectric element 13 can be deformed by the vibration. Therefore, two-dimensional vibration in the X-direction and Z-direction can be utilized for generating power.

A specific connecting structure between the first vibrating portion 102a, the second vibrating portion 102b, and the bent portion 102c is arbitrary, and the same connecting structure as that between the first vibrating portion 72a, and the second vibrating portion 72b, and the bent portion 72c described in the fifth embodiment can be employed, for example. Portions of the pair of vibration boards 102 can be integrally formed together, or a pair of the second vibrating portions 102b can be connected to the common first vibrating portion 102a.

When the power generation module 101 formed in this manner is used instead of the power generation modules 11, 35, 41, 51, 61, 71, 81, and 91 according to the first to seventh embodiments, or used together with the power generation modules 11, 35, 41, 51, 61, 71, 81, and 91, it is possible to further enhance the power generating efficiency.

Effect of Eighth Embodiment

According to the eighth embodiment, because two-dimensional vibration in the Z-direction and X-direction can be utilized for generating power, it is possible to further enhance the power generating efficiency.

Ninth Embodiment

A ninth embodiment is explained next. This embodiment is a mode in which the shape of the vibration board of the power generation module according to the eighth embodiment is changed. The configuration of the ninth embodiment is substantially identical to the configuration of the eighth embodiment unless otherwise specified. Constituent elements of the ninth embodiment substantially identical to those of the eighth embodiment are denoted by like reference numerals and/or names used in the eighth embodiment as necessary, and explanations thereof will be omitted.

Figure 14:
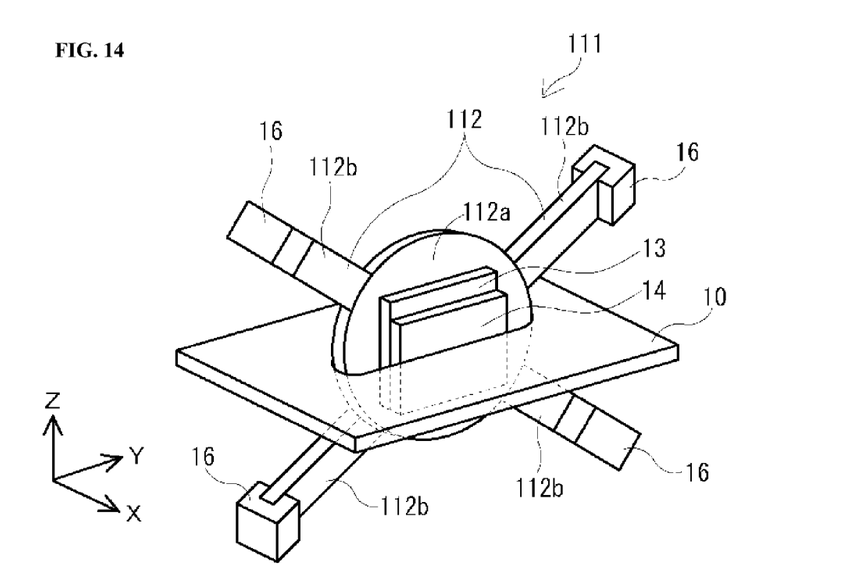
FIG. 14 A perspective view of relevant parts of a power generation module according to a ninth embodiment.

FIG. 14 is a perspective view of relevant parts of a power generation module according to the ninth embodiment. A power generation module 111 according to the ninth embodiment includes a vibration board 112. The vibration board 112 is configured to include a disk-like first vibrating portion 112a fixed in a direction (the Z-direction shown in the drawing) along the piezoelectric element 13 and plural (four, in this embodiment) second vibrating portions 112b arranged in a radial direction outward with respect to the first vibrating portion 112a. The weights 16 are fixed to free ends of the second vibrating portions 112b. A portion of the body 10 is formed in a plate body whose lower portion is opened, and the power generation module 111 is sandwiched and fixed in the plate-like body 10. According to this structure, when vibration along the X-direction perpendicular to the Z-direction and the Y-direction is generated, the first vibrating portion 112a vibrates, and when vibration along the Z-direction is generated, the second vibrating portions 112b vibrate, and thus the piezoelectric element 13 can be deformed by the vibration. Therefore, two-dimensional vibration in the X-direction and Z-direction can be utilized for generating power. The arrangement number of the second vibrating portions 112b with respect to the first vibrating portion 112a and the connecting angle thereof can be arbitrarily changed.

A specific connecting structure between the first vibrating portion 112a and the second vibrating portions 112b is arbitrary. For example, one plate member can be pressed into the first vibrating portion 112a and the second vibrating portions 112b as one member, or the first vibrating portion 112a and the second vibrating portions 112b can be formed as separated members, and thereafter they can be connected to each other by a known connecting method including welding.

When the power generation module 111 formed in this manner is used instead of the power generation modules 11, 35, 41, 51, 61, 71, 81, 91, and 101 according to the first to eighth embodiments, or used together with the power generation modules 11, 35, 41, 51, 61, 71, 81, 91, and 101, it is possible to further enhance the power generating efficiency.

Effect of Ninth Embodiment

According to the ninth embodiment, because two-dimensional vibration in the Z-direction and X-direction can be utilized for generating power, it is possible to further enhance the power generating efficiency.

[III] Modifications of Respective Embodiments

While respective embodiments of the present invention have been explained above, specific configurations and means of the present invention can be arbitrarily modified or improved within the technical scope of the respective inventions described in the claims. Such modifications are explained below.

(Regarding Problem to be Solved by the Invention and Effect of the Invention)

The problem to be solved by the invention and the effect of the invention are not limited to those described above, and the present invention can also solve problems not mentioned above or achieve effects not mentioned above. Further, in the present invention, only a part of the problem described above may be solved and only a part of the effect described above may be achieved.

(Regarding Specific Application of Power Generation Module)

In the above embodiments, while the power generation module is provided on the upper surface or the bottom surface of the body 10, the power generation module can be provided on the side surface of the body 10. The shape and arrangement of the piezoelectric element 13, the vibration board 12, the fixed board 14, the stopper 15, and the weight 16 are arbitrary unless otherwise specified.

According to the above mentioned embodiments, because the piezoelectric element is deformed through the vibration board, a greater electromotive force can be obtained from the piezoelectric element and the power generating efficiency can be enhanced. Particularly, by using the deformation promoting unit to promote the deformation of the piezoelectric element, the power generating efficiency can be further enhanced.

According to the above mentioned embodiments, because the deformation promoting unit is provided as the fixing unit, deformation of the piezoelectric element around the fixed board can be promoted, and thus the power generating efficiency can be further enhanced.

According to the above mentioned embodiments, because the end of the fixing unit can abut against the widest portion of the side surface of the piezoelectric element, the deformation of the piezoelectric element can be further promoted, and thus the power generating efficiency can be further enhanced.

According to the above mentioned embodiments, it is possible to prevent the vibration board from being damaged by restricting the vibration range of the vibration board, and durability of the power generation module can be enhanced.

According to the above mentioned embodiments, the deformation promoting unit is the weight that is fixed to the free end of the vibration board or that can collide against the free end. Therefore, the vibration of the vibration board is promoted by the weight, deformation of the piezoelectric element can be promoted, and thus the power generating efficiency can be further enhanced.

According to the above mentioned embodiments, the vibration board can be vibrated by the wind receiving unit. Therefore, even if there is no vibration, when there is a wind, the vibration board can be vibrated to generate power.

According to the above mentioned embodiments, the vibration board is formed using the first vibrating portion extending along the piezoelectric element and the second vibrating portion that intersects with the first vibrating portion at right angles. Therefore, the vibration board can be vibrated by utilizing two-dimensional vibration, and the power generating efficiency can be further enhanced.

According to the above mentioned embodiments, the vibration board, the piezoelectric element, and the deformation promoting unit are arranged in a road. Therefore, power can be generated by utilizing vibration from cars that run on the road, and it is possible to effectively utilize the vibration energy that has been conventionally wasted.

According to the above mentioned embodiments, the power generation unit is provided in the hollow part of the body. Therefore, power can be generated by utilizing vibration of the body, and it is possible to effectively utilize the vibration energy that has been conventionally wasted.

According to the above mentioned embodiments, the body is made of a translucent member and formed in a shape of a lure, and the light emitting unit is provided in the hollow part of the body. Therefore, light emitted by the light emitting unit calls attention of fish, and thus the fish collecting performance of the lure can be enhanced.

INDUSTRIAL APPLICABILITY

The power generation unit according to the present invention can be applied to a power generation unit that can convert an externally applied force into electricity and take it out. Particularly, the power generation unit is useful to transmit vibration to the piezoelectric element 13 effectively to obtain a high power generation capacity.

The invention claimed is:

1. A power generation unit comprising:
a flexible vibration board;
a piezoelectric element fixed on at least one of surfaces of the vibration board; and
a deformation promoting unit that promotes deformation of the piezoelectric element caused by vibration of the vibration board, wherein
the deformation promoting unit is a fixing unit that is arranged on a side of the piezoelectric element and at a position where the deformation promoting unit sandwiches the piezoelectric element together with the vibration board, and
one end of the vibration board and one end of the fixing unit are fixed on a same installation surface.

2. The power generation unit according to claim 1, wherein one of ends of the fixing unit that is opposite from the one end fixed on the installation surface can abut against a widest portion of a side surface of the piezoelectric element.

3. The power generation unit according to claim 1, wherein a restricting unit that restricts a vibration range of the vibration board is provided on a side of the fixing unit.

4. A power generation unit comprising:
a flexible vibration board;
a piezoelectric element fixed on at least one of surfaces of the vibration board; and a deformation promoting unit that promotes deformation of the piezoelectric element caused by vibration of the vibration board, wherein the vibration board includes a first vibrating portion extending along the piezoelectric element and a second vibrating portion that intersects with the first vibrating portion at right angles.

5. The power generation unit according to claim 4, wherein the vibration board, the piezoelectric element, and the deformation promoting unit are arranged in a road.

6. A light emitting tool comprising a body having a hollow part, wherein the power generation unit according to claim 4 is provided in the hollow part of the body.

7. The light emitting tool according to claim 6, wherein the body is made of a translucent member and formed in a shape of a lure, and a light emitting unit that emits light by an electromotive force of the piezoelectric element is provided in the hollow part of the body.

8. The power generation unit according to claim 2, wherein the vibration board, the piezoelectric element, and the deformation promoting unit are arranged in a road.

9. A light emitting tool comprising a body having a hollow part, wherein the power generation unit according to claim 2 is provided in the hollow part of the body.

10. The light emitting tool according to claim 9, wherein the body is made of a translucent member and formed in a shape of a lure, and a light emitting unit that emits light by an electromotive force of the piezoelectric element is provided in the hollow part of the body.

* * * * *